United States Patent
Huang et al.

(10) Patent No.: US 10,058,009 B2
(45) Date of Patent: Aug. 21, 2018

(54) EXTERNAL FUNCTION EXTENSION DEVICE

(71) Applicant: COOLER MASTER CO., LTD., New Taipei (TW)

(72) Inventors: Shih-Wei Huang, New Taipei (TW); Shui-Fa Tsai, New Taipei (TW)

(73) Assignee: COOLER MASTER CO., LTD., New Taipei (TW)

( * ) Notice: Subject to any disclaimer, the term of this patent is extended or adjusted under 35 U.S.C. 154(b) by 0 days.

(21) Appl. No.: 15/588,692

(22) Filed: May 7, 2017

(65) Prior Publication Data
US 2017/0359920 A1    Dec. 14, 2017

(30) Foreign Application Priority Data
Jun. 8, 2016 (TW) .............................. 105118099 A (51) Int. Cl.
| | | |
|---|---|---|
| *H05K 7/20* | (2006.01) | |
| *H05K 7/14* | (2006.01) | |
| *G06F 1/18* | (2006.01) | |
| *G06F 1/20* | (2006.01) | |
| *H01L 23/34* | (2006.01) | |

(52) U.S. Cl.
CPC ......... *H05K 7/20327* (2013.01); *G06F 1/186* (2013.01); *G06F 1/20* (2013.01); *H01L 23/34* (2013.01); *H05K 7/1461* (2013.01); *H05K 7/20172* (2013.01); *H05K 7/20254* (2013.01)

(58) Field of Classification Search
CPC ............. H05K 7/20327; H05K 7/1461; H05K 7/20254; H05K 7/20172; G06F 1/186

USPC .................................................... 361/679.47
See application file for complete search history.

(56) References Cited

U.S. PATENT DOCUMENTS

| | | | | |
|---|---|---|---|---|
| 5,731,954 A | * | 3/1998 | Cheon ...................... | F25B 21/02 165/104.33 |
| 5,862,037 A | * | 1/1999 | Behl ........................ | F04D 25/08 361/679.48 |
| 5,898,568 A | * | 4/1999 | Cheng .................. | H05K 5/0273 165/122 |

(Continued)

FOREIGN PATENT DOCUMENTS

| | | |
|---|---|---|
| CN | 204425880 U | 6/2015 |
| TW | 585307 | 4/2004 |

(Continued)

*Primary Examiner* — Anatoly Vortman
(74) *Attorney, Agent, or Firm* — Maschoff Brennan (57) ABSTRACT

An external function extension device includes a casing, a transition circuit board, a liquid cooling system, at least one connecting member and a power supply unit. The transition circuit board, the liquid cooling system and the power supply unit are disposed in the casing. The transition circuit board has a transition slot. The connecting member is connected to the liquid cooling system. The connecting member is used for connecting an external device, such that the liquid cooling system performs liquid cooling function for dissipating heat of the external device. The power supply unit is electrically connected to the transition circuit board and the liquid cooling system. The power supply unit includes an electric connector. The electric connector is used for connecting the external device, such that the power supply unit supplies power to the external device.

12 Claims, 14 Drawing Sheets

(56) References Cited

U.S. PATENT DOCUMENTS

| | | | | |
|---|---|---|---|---|
| 6,034,871 A * | 3/2000 | Cheng | G06F 1/203 | |
| | | | 165/104.34 | |
| 6,104,607 A * | 8/2000 | Behl | G06F 1/203 | |
| | | | 165/80.3 | |
| 6,118,654 A * | 9/2000 | Bhatia | G06F 1/203 | |
| | | | 165/104.14 | |
| 6,181,553 B1 * | 1/2001 | Cipolla | G06F 1/1632 | |
| | | | 165/104.33 | |
| 6,276,448 B1 * | 8/2001 | Maruno | G06F 1/1632 | |
| | | | 165/104.33 | |
| 6,453,378 B1 * | 9/2002 | Olson | G06F 1/1632 | |
| | | | 361/679.41 | |
| 6,510,052 B2 * | 1/2003 | Ishikawa | F28D 1/0308 | |
| | | | 165/104.33 | |
| 6,571,340 B1 * | 5/2003 | Lee | G06F 1/1632 | |
| | | | 700/299 | |
| 6,657,859 B1 * | 12/2003 | Karr | G06F 1/203 | |
| | | | 165/104.21 | |
| 6,725,682 B2 * | 4/2004 | Scott | G06F 1/20 | |
| | | | 165/80.3 | |
| 6,807,056 B2 * | 10/2004 | Kondo | G06F 1/20 | |
| | | | 165/104.33 | |
| 6,914,782 B2 * | 7/2005 | Ku | G06F 1/203 | |
| | | | 165/80.3 | |
| 6,966,358 B2 * | 11/2005 | Rapaich | G06F 1/1632 | |
| | | | 165/104.33 | |
| 7,012,807 B2 * | 3/2006 | Chu | G06F 1/20 | |
| | | | 165/104.33 | |
| 7,086,452 B1 * | 8/2006 | Senyk | G06F 1/203 | |
| | | | 165/104.33 | |
| 7,321,491 B2 * | 1/2008 | Long | G06F 1/203 | |
| | | | 165/104.33 | |
| 7,333,334 B2 * | 2/2008 | Yamatani | G06F 1/20 | |
| | | | 165/122 | |
| 7,529,089 B2 | 5/2009 | Cheng | | |
| 7,586,741 B2 * | 9/2009 | Matsushima | G06F 1/206 | |
| | | | 361/679.46 | |
| 7,675,748 B2 * | 3/2010 | Matsushima | G11B 33/128 | |
| | | | 361/679.47 | |
| 7,948,750 B2 * | 5/2011 | Hung | G06F 1/183 | |
| | | | 165/185 | |
| 8,493,735 B2 * | 7/2013 | Iijima | G06F 1/20 | |
| | | | 361/679.53 | |
| 8,611,083 B2 * | 12/2013 | Kumlin | G06F 1/20 | |
| | | | 165/108 | |
| 8,693,196 B2 * | 4/2014 | Wu | G06F 1/182 | |
| | | | 361/679.47 | |
| 8,713,956 B2 * | 5/2014 | Couto | G06F 1/1632 | |
| | | | 165/80.2 | |
| 9,600,044 B2 * | 3/2017 | Liao | G06F 1/203 | |
| 2003/0039097 A1 * | 2/2003 | Igarashi | G06F 1/203 | |
| | | | 361/679.21 | |
| 2004/0008483 A1 * | 1/2004 | Cheon | G06F 1/20 | |
| | | | 361/679.53 | |
| 2005/0225942 A1 * | 10/2005 | Lee | G06F 1/203 | |
| | | | 361/700 | |
| 2006/0137863 A1 | 6/2006 | Lee | | |

FOREIGN PATENT DOCUMENTS

| | | |
|---|---|---|
| TW | M291027 | 5/2006 |
| TW | M318751 | 9/2007 |
| TW | M344506 | 11/2008 |
| TW | M470480 U | 1/2014 |

* cited by examiner

EXTERNAL FUNCTION EXTENSION DEVICE

BACKGROUND OF THE INVENTION

1. Field of the Invention

The invention relates to an external function extension device and, more particularly, to an external function extension device having a liquid cooling system.

2. Description of the Prior Art

As technology advances and develops, computers are considered a necessity by a lot of people in their daily lives. To provide various functions for the computer, a main board of the computer usually has a plurality of function extension slots for installing a plurality of extension cards such as graphics card, sound card, network card and so on, so as to enhance additional functions. However, as the computer function extends, the size of the extension card also increases, such that the extension cards installed in limited space may interfere with each other. Furthermore, when the function extension card is operating, the current in circuit will generate unnecessary heat due to impedance. If the heat is accumulated in the electronic components of the function extension card without dissipating immediately, the electronic components may get damage due to the accumulated heat. Therefore, how to prevent the function extension card from occupying the limited space in the computer and enhance heat dissipating efficiency for the function extension card has become a significant issue in design.

SUMMARY OF THE INVENTION

The invention provides an external function extension device having a liquid cooling system, so as to solve the aforesaid problems.

According to an embodiment of the invention, an external function extension device comprises a casing, a transition circuit board, a liquid cooling system and a power supply unit. The transition circuit board, the liquid cooling system and the power supply unit are disposed in the casing. The transition circuit board has a transition slot. The power supply unit is electrically connected to the transition circuit board and the liquid cooling system.

Preferably, the external function extension device may further comprise a function extension card disposed in the casing and inserted into the transition slot.

According to another embodiment of the invention, an external function extension device comprises a casing, a transition circuit board, a liquid cooling system, at least one connecting member and a power supply unit. The transition circuit board, the liquid cooling system and the power supply unit are disposed in the casing. The transition circuit board has a transition slot. The connecting member is connected to the liquid cooling system. The connecting member is used for connecting an external device, such that the liquid cooling system performs a liquid cooling function for dissipating heat of the external device. The power supply unit is electrically connected to the transition circuit board and the liquid cooling system. The power supply unit comprises an electric connector. The electric connector is used for connecting the external device, such that the power supply unit supplies power to the external device.

As mentioned in the above, the invention integrates the transition circuit board with the transition slot and the liquid cooling system into the external function extension device. A user may insert a function extension card (e.g. graphics card, sound card, network card and so on) into the transition slot after purchasing the external function extension device or, alternatively, a manufacturer may insert a function extension card into the transition slot before selling the external function extension device. Then, the user may connect the function extension card of the external function extension device to a computer, so as to enhance additional functions. Since the function extension card is disposed in the external function extension device, the invention can prevent the function extension card from occupying the limited space in the computer. Furthermore, since the external function extension device has the liquid cooling system disposed therein, the invention can use the liquid cooling system to dissipate heat of the function extension card, so as to enhance heat dissipating efficiency for the function extension card. Moreover, the user may use the connecting member to connect the external device, such that the liquid cooling system performs liquid cooling function for dissipating heat of the external device. Still further, the user may use the electric connector to connect the external device, such that the power supply unit supplies power to the external device.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
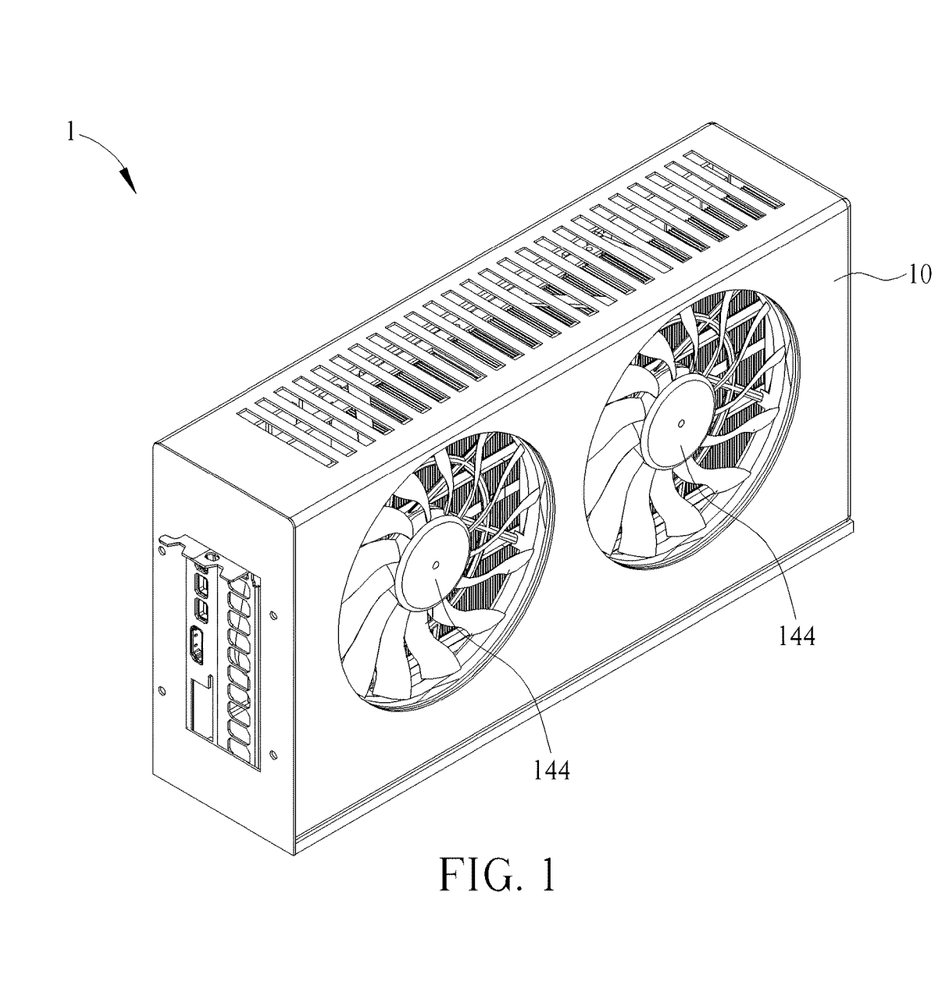
FIG. 1 is a schematic view illustrating an external function extension device according to an embodiment of the invention.
Figure 2:
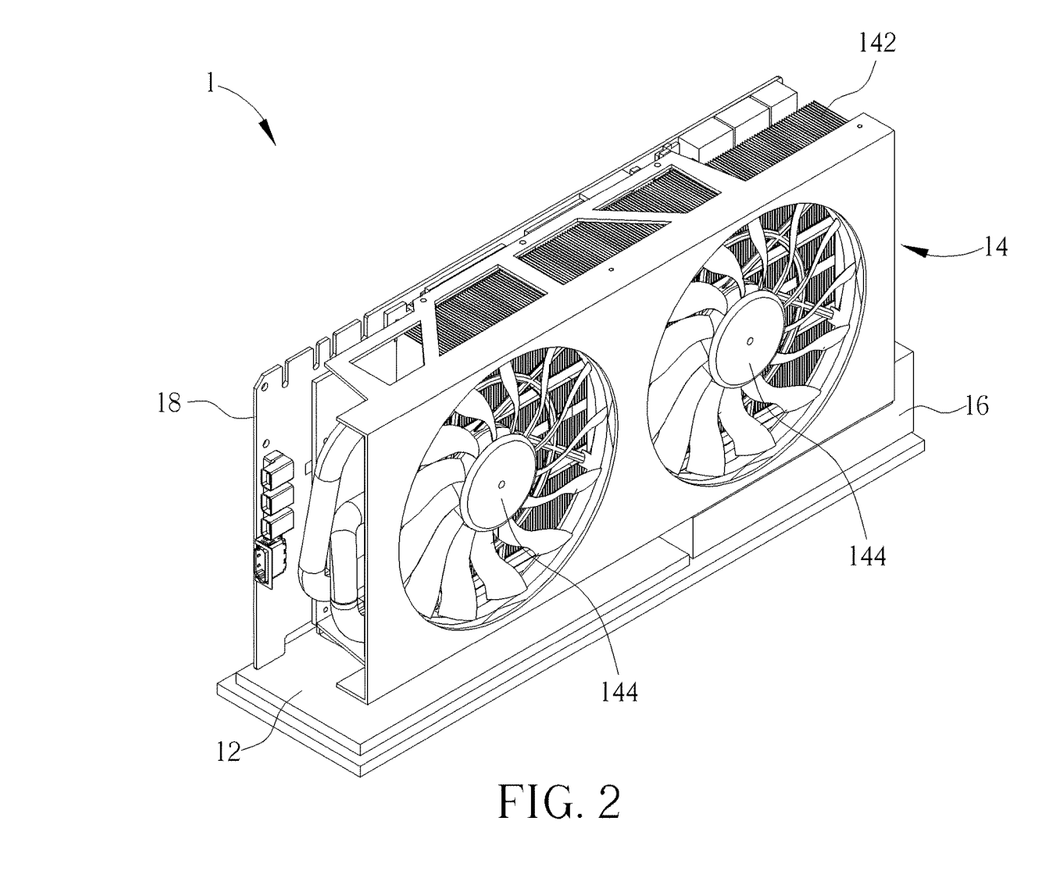
FIG. 2 is a schematic inner view illustrating the external function extension device shown in FIG. 1 after removing the casing.
Figure 3:
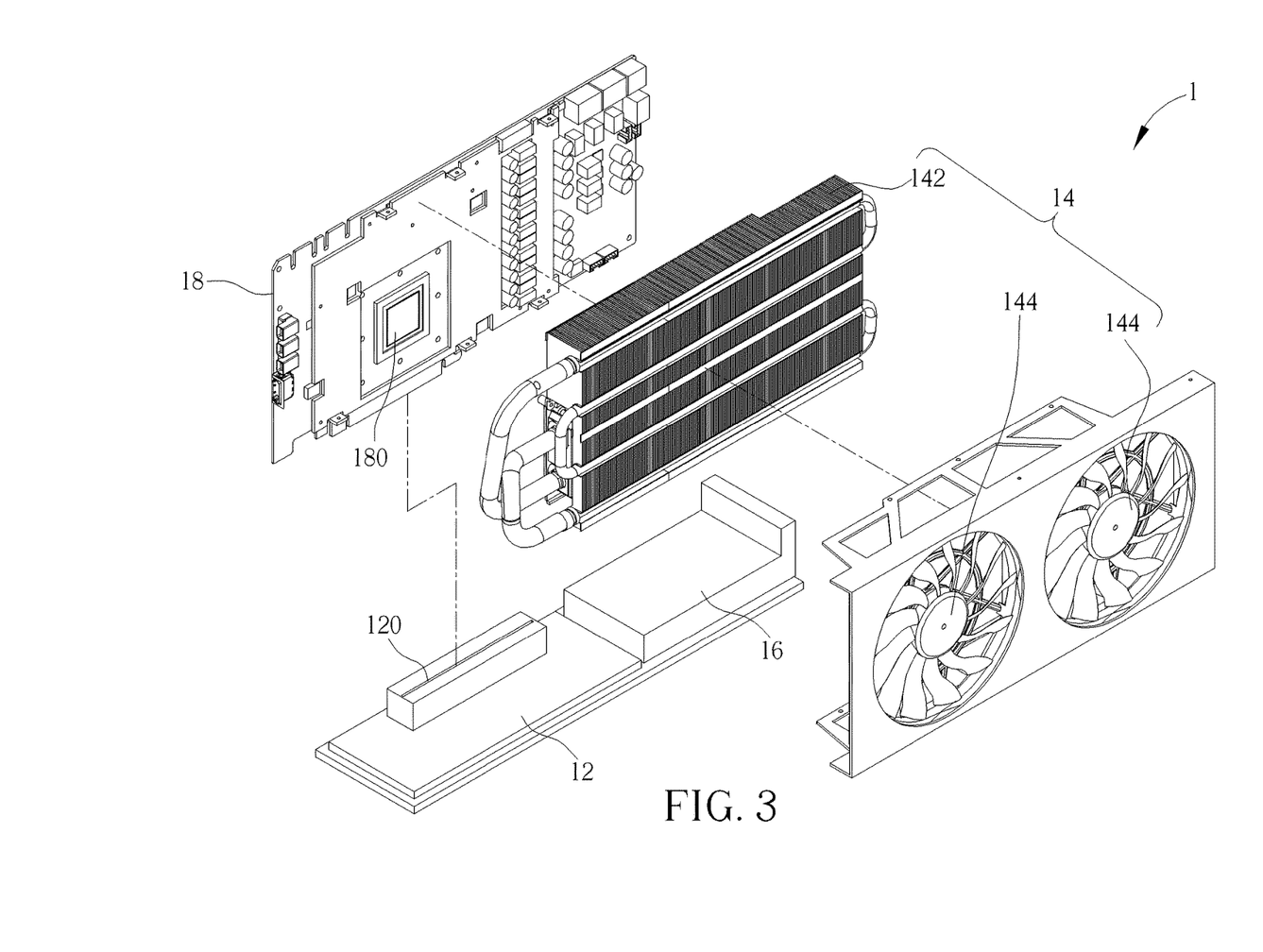
FIG. 3 is an exploded view illustrating the external function extension device shown in FIG. 2.
Figure 4:
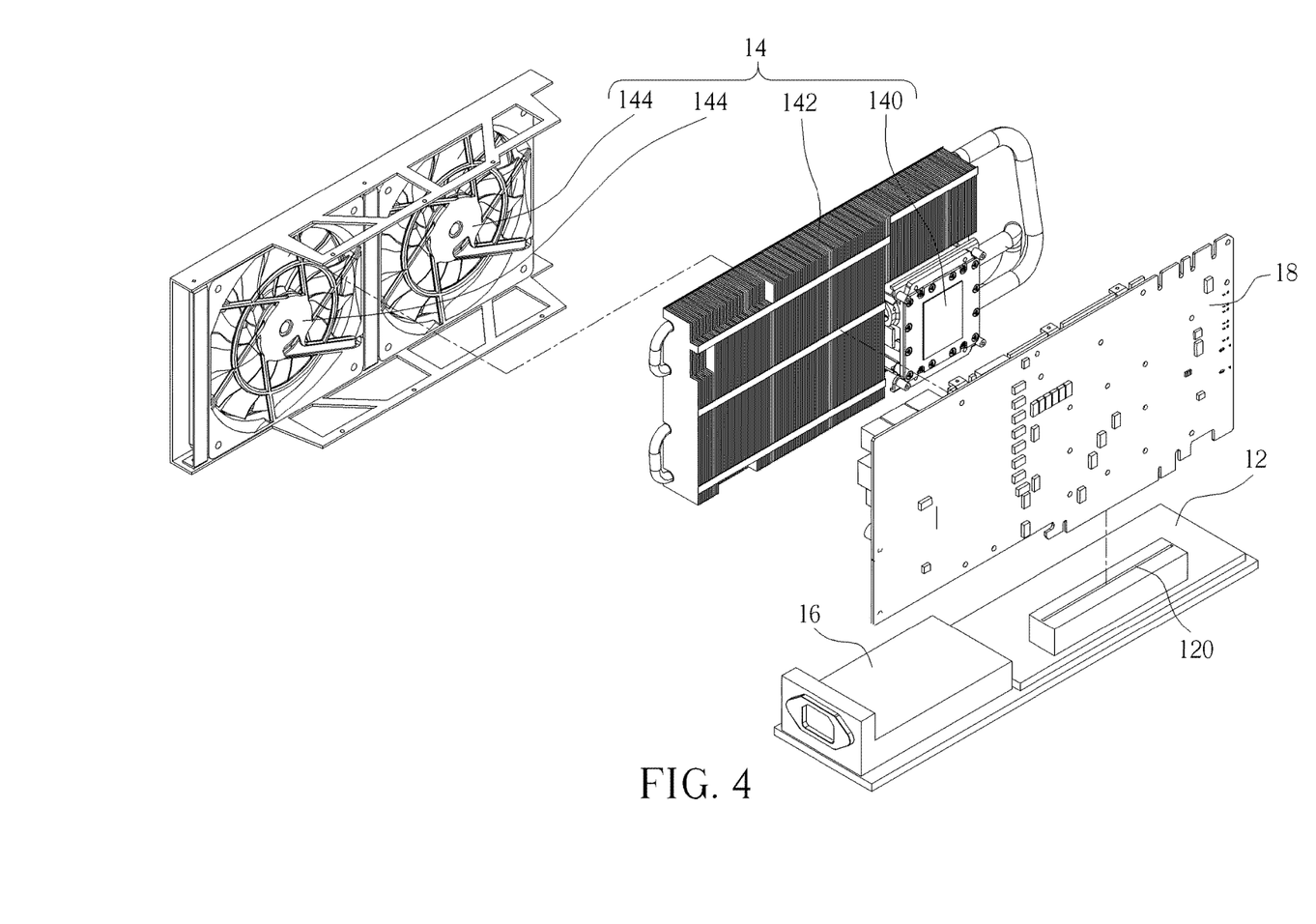
FIG. 4 is an exploded view illustrating the external function extension device shown in FIG. 2 from another viewing angle.

Referring to FIGS. 1 to 4, FIG. 1 is a schematic view illustrating an external function extension device 1 according to an embodiment of the invention, FIG. 2 is a schematic inner view illustrating the external function extension device 1 shown in FIG. 1 after removing the casing 10, FIG. 3 is an exploded view illustrating the external function extension device 1 shown in FIG. 2, and FIG. 4 is an exploded view illustrating the external function extension device 1 shown in FIG. 2 from another viewing angle.

As shown in FIGS. 1 to 4, the external function extension device 1 comprises a casing 10, a transition circuit board 12, a liquid cooling system 14, a power supply unit 16 and a function extension card 18, wherein the transition circuit board 12, the liquid cooling system 14, the power supply unit 16 and the function extension card 18 are dispose in the casing 10. The transition circuit board 12 has a transition slot 120. The function extension card 18 is inserted into the transition slot 120. The power supply unit 16 is electrically connected to the transition circuit board 12 and the liquid cooling system. 14 and used for supplying power to the transition circuit board 12, the liquid cooling system 14 and the function extension card 18 when being operating.

In this embodiment, the function extension card 18 may be a graphics card, a sound card, a network card and so on according to practical applications. Furthermore, the function extension card 18 may be detachably inserted into the transition slot 120. Therefore, a user may insert the function extension card 18 into the transition slot 120 after purchasing the external function extension device 1 or, alternatively, a manufacturer may insert the function extension card 18 into the transition slot 120 before selling the external function extension device 1. In other words, the external function extension device 1 of the invention may or may not be equipped with the function extension card 18 in advance according to practical applications. Then, the user may connect the function extension card 18 of the external function extension device 1 to a computer (not shown), so as to enhance additional functions. Since the function extension card 18 is disposed in the external function extension device 1, the invention can prevent the function extension card 18 from occupying the limited space in the computer.

In this embodiment, the liquid cooling system 14 may comprise a cold plate 140, a radiator 142 and at least one fan 144, wherein the cold plate 140 and the radiator 142 are connected to each other by tubes and the fan 144 is disposed at a side of the radiator 142. Furthermore, the cold plate 140 may has a pump function. It should be noted that if the cold plate does not have a pump function, a pump (not shown) may be disposed on the cold plate 140 or the radiator 142. When the function extension card 18 is inserted into the transition slot 120, the cold plate 140 may be attached to a processing chip 180 of the function extension card 18, so as to absorb heat generated by the processing chip 180 when being operating and then dissipate heat through the radiator 142 and the fan 144. In practical applications, the liquid cooling system 14 contains a cooling liquid (e.g. water or other liquids, not shown). Accordingly, the invention can use the liquid cooling system 14 to dissipate heat of the function extension card 18, so as to enhance heat dissipating efficiency for the function extension card 18.

Figure 5:
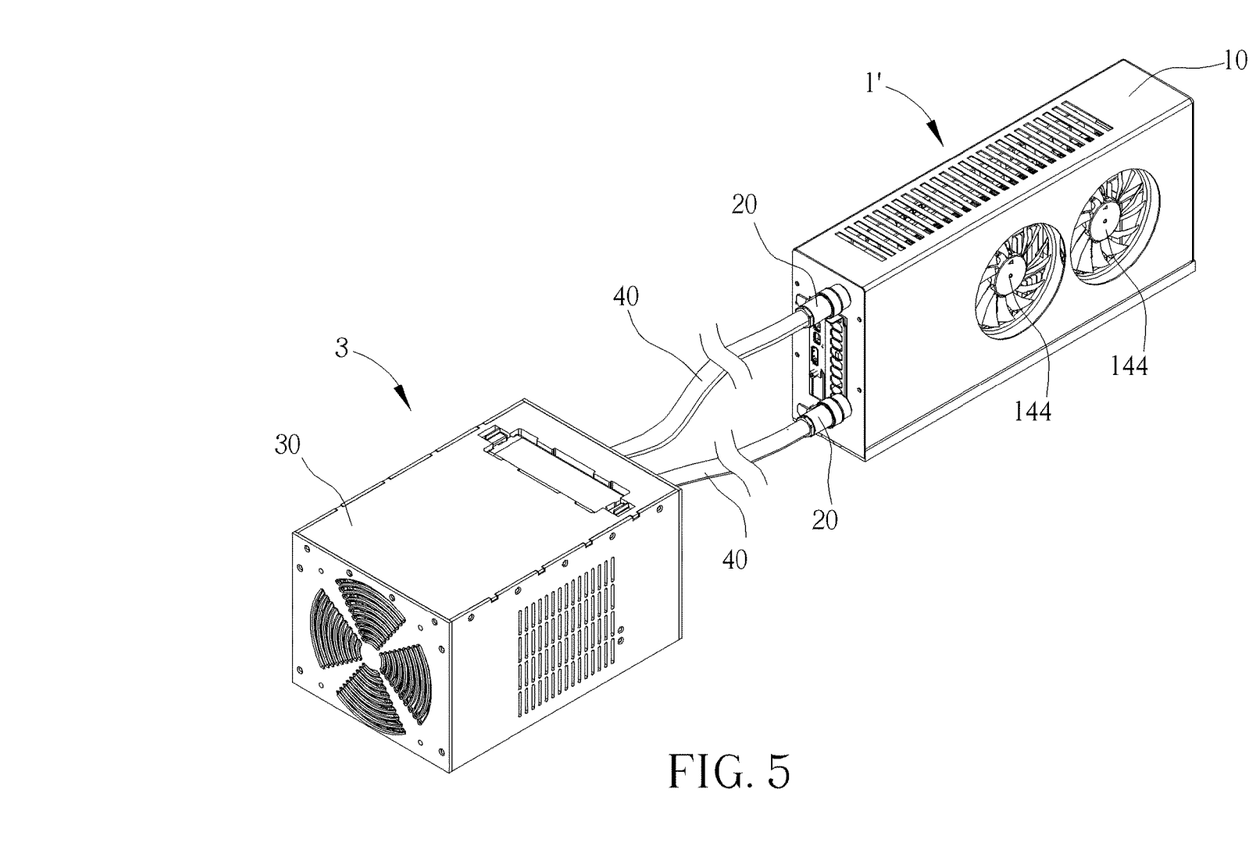
FIG. 5 is a schematic view illustrating an external function extension device and an external device according to another embodiment of the invention.
Figure 6:
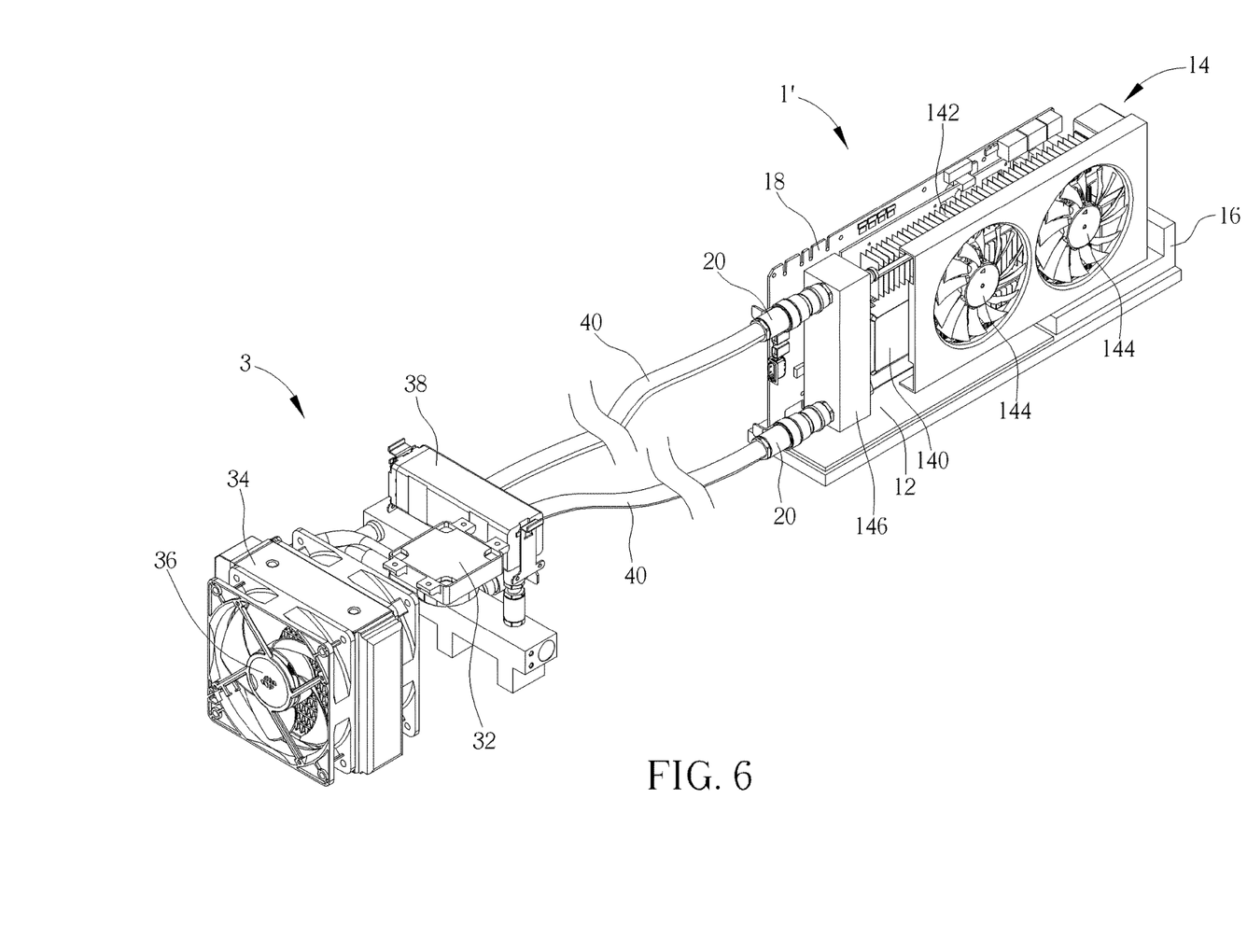
FIG. 6 is a schematic inner view illustrating the external function extension device shown in FIG. 5 after removing the casing and the external device shown in FIG. 5 after removing the casing.
Figure 7:
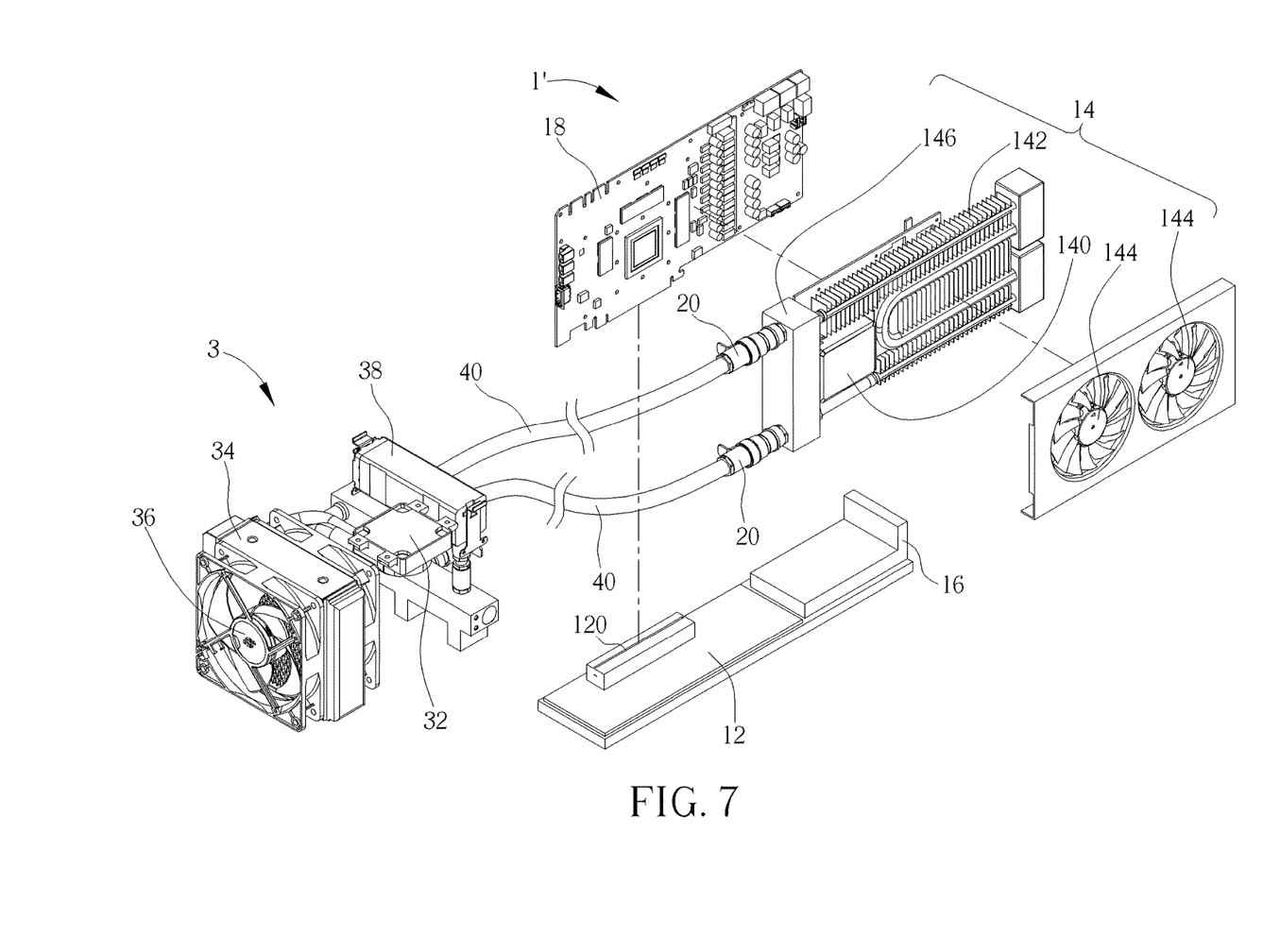
FIG. 7 is an exploded view illustrating the external function extension device shown in FIG. 6.

Referring to FIGS. 5 to 7, FIG. 5 is a schematic view illustrating an external function extension device 1' and an external device 3 according to another embodiment of the invention, FIG. 6 is a schematic inner view illustrating the external function extension device 1' shown in FIG. 5 after removing the casing 10 and the external device 3 shown in FIG. 5 after removing the casing 30, and FIG. 7 is an exploded view illustrating the external function extension device 1' shown in FIG. 6. The main difference between the external function extension device 1' and the aforesaid external function extension device 1 is that the external function extension device 1' further comprises at least one connecting member 20, as shown in FIGS. 5 to 7. In this embodiment, the external function extension device 1' comprises two connecting members 20, but is not so limited. Furthermore, the liquid cooling system 14 further comprises a liquid storage box 146 connected to the radiator 142. The connecting members 20 are connected to the liquid storage box 146 of the liquid cooling system 14.

When the function extension card 18 is used for a long time and the liquid cooling system 14 cannot dissipate heat effectively, the connecting member 20 may be used for connecting an external device 3. In this embodiment, the external device 3 may comprise a casing 30, a pump 32, a radiator 34, at least one fan 36 and a liquid storage box 38, wherein the pump 32, the radiator 34, the fan 36 and the liquid storage box 38 are disposed in the casing 30, the pump 32, the radiator 34 and the liquid storage box 38 are connected to each other through tubes, and the fan 36 is disposed at a side of the radiator 34. When the connecting member 20 is connected to the liquid storage box 38 of the external device 3 through a tube 40, the liquid cooling system 14 and the external device 3 form a liquid cooling circulation path through the connecting member 20 and the tube 40. At this time, the external device 3 may assist the liquid cooling system 14 of the external function extension device 1' in dissipating heat, so as to enhance heat dissipating efficiency for the function extension card 18. When the external device 3 finishes dissipating heat for the external function extension device 1', the user only has to separate the tube 40 from the connecting member 20.

In this embodiment, the connecting member 20 may be a quick connector, such that the tube 40 may be connected to or separated from the connecting member 20 rapidly and conveniently. In practical applications, the liquid cooling system 14 contains a cooling liquid (e.g. water or other liquids). Accordingly, in some embodiments, the quick connector served as the connecting member 20 may have quick attaching/detaching structure and have some structures for preventing the cooling liquid from leaking out of the liquid cooling system 14. Therefore, when the tube 40 is separated from the connecting member 20, the connecting member 20 may prevent the cooling liquid from leaking out of the liquid cooling system 14. It should be noted that the same elements in FIGS. 5-7 and FIGS. 1-4 are represented by the same numerals, so the repeated explanation will not be depicted herein again.

Figure 8:
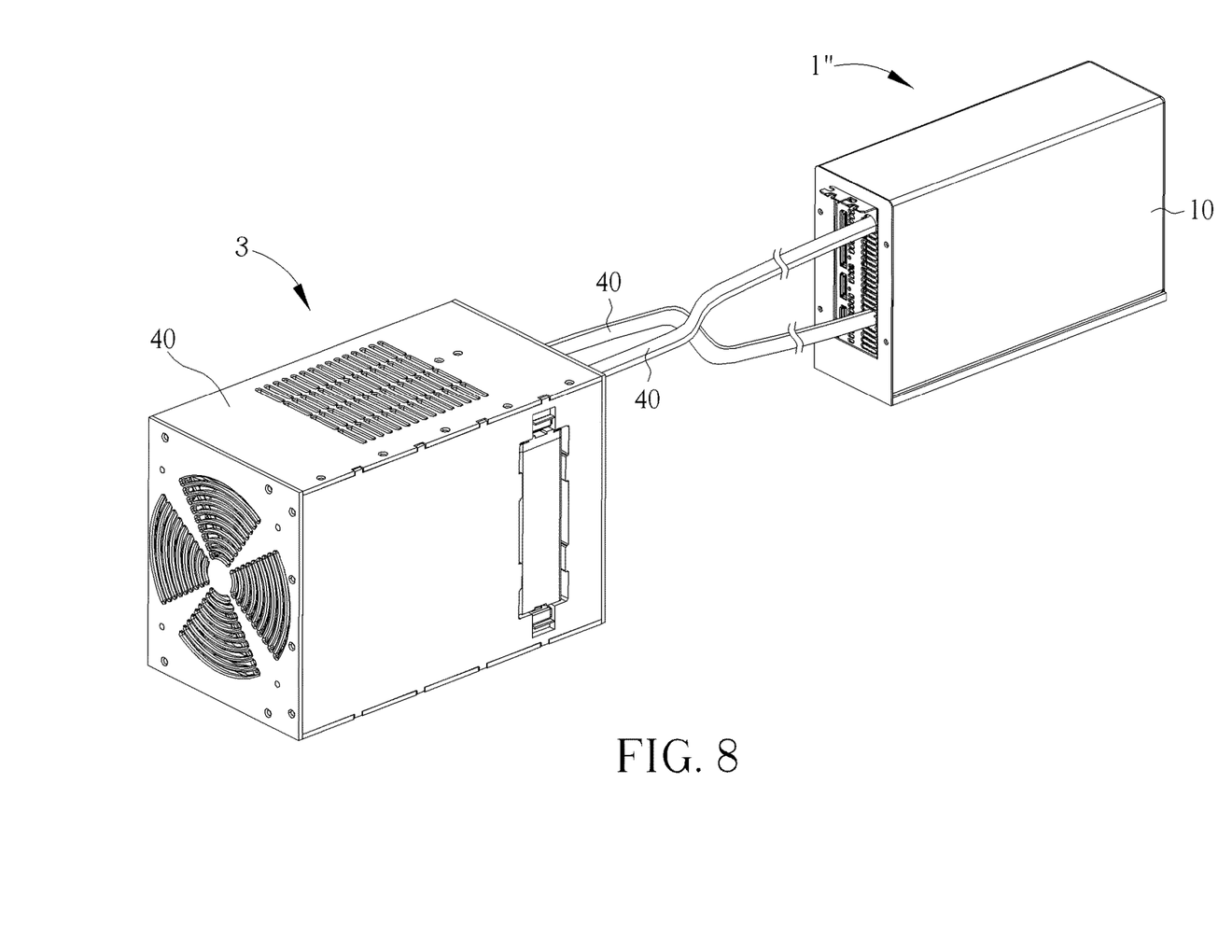
FIG. 8 is a schematic view illustrating an external function extension device and an external device according to another embodiment of the invention.
Figure 9:
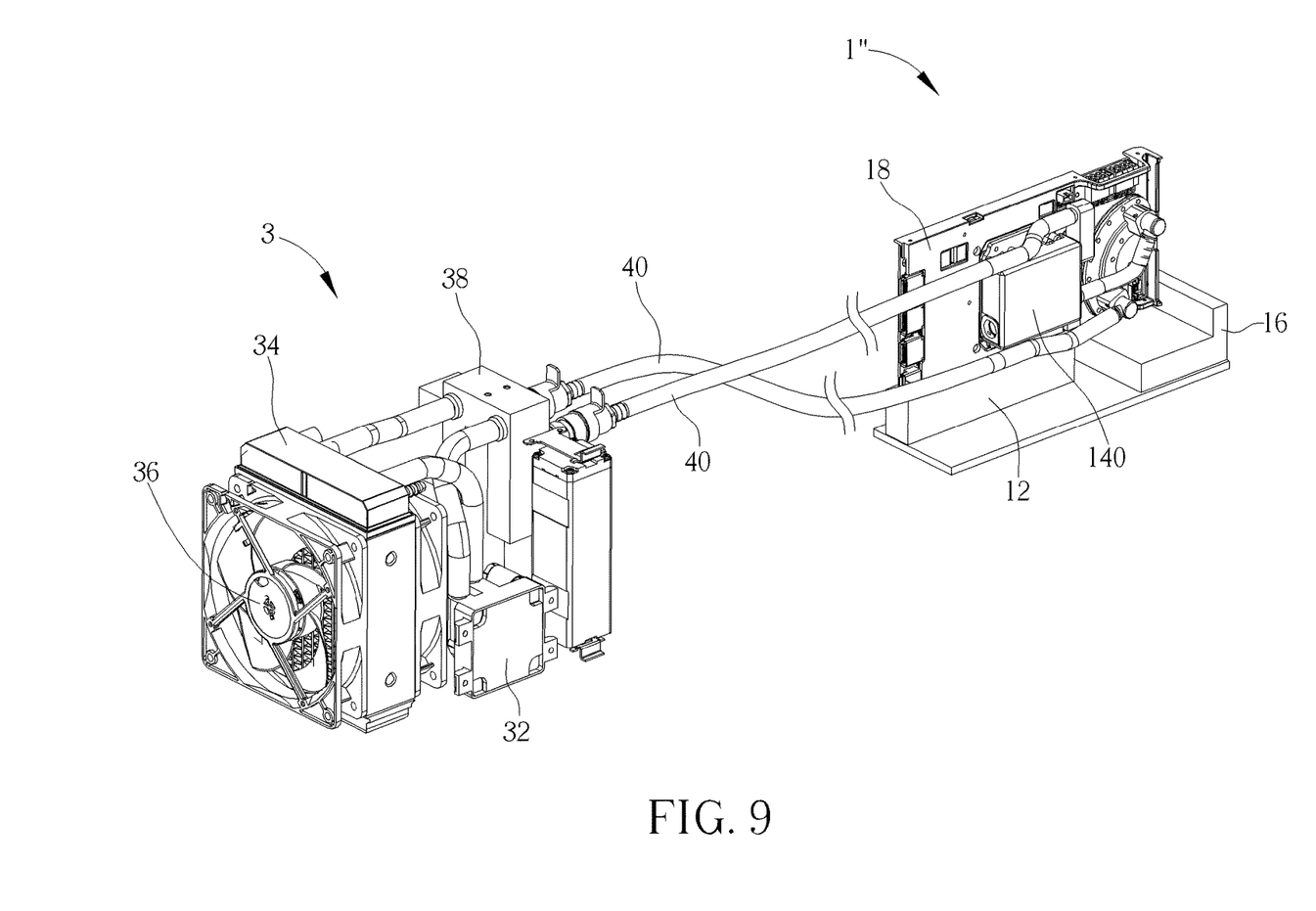
FIG. 9 is a schematic inner view illustrating the external function extension device shown in FIG. 8 after removing the casing and the external device shown in FIG. 8 after removing the casing.

Referring to FIGS. 8 and 9, FIG. 8 is a schematic view illustrating an external function extension device 1" and an external device 3 according to another embodiment of the invention, and FIG. 9 is a schematic inner view illustrating the external function extension device 1" shown in FIG. 8 after removing the casing 10 and the external device 3 shown in FIG. 8 after removing the casing 30. The main difference between the external function extension device 1' and the aforesaid external function extension device 1' is that the cold plate 140 of the external function extension device 1" is connected to the external device 30 through the tube 40 directly, such that the cold plate 140 and the external device 3 form a liquid cooling circulation path through the tube 40. At this time, the external device 3 may cooperate with the cold plate 140 to dissipate heat for the function extension card 18 of the external function extension device 1". It should be noted that the same elements in FIGS. 8-9 and FIGS. 5-7 are represented by the same numerals, so the repeated explanation will not be depicted herein again.

Figure 10:
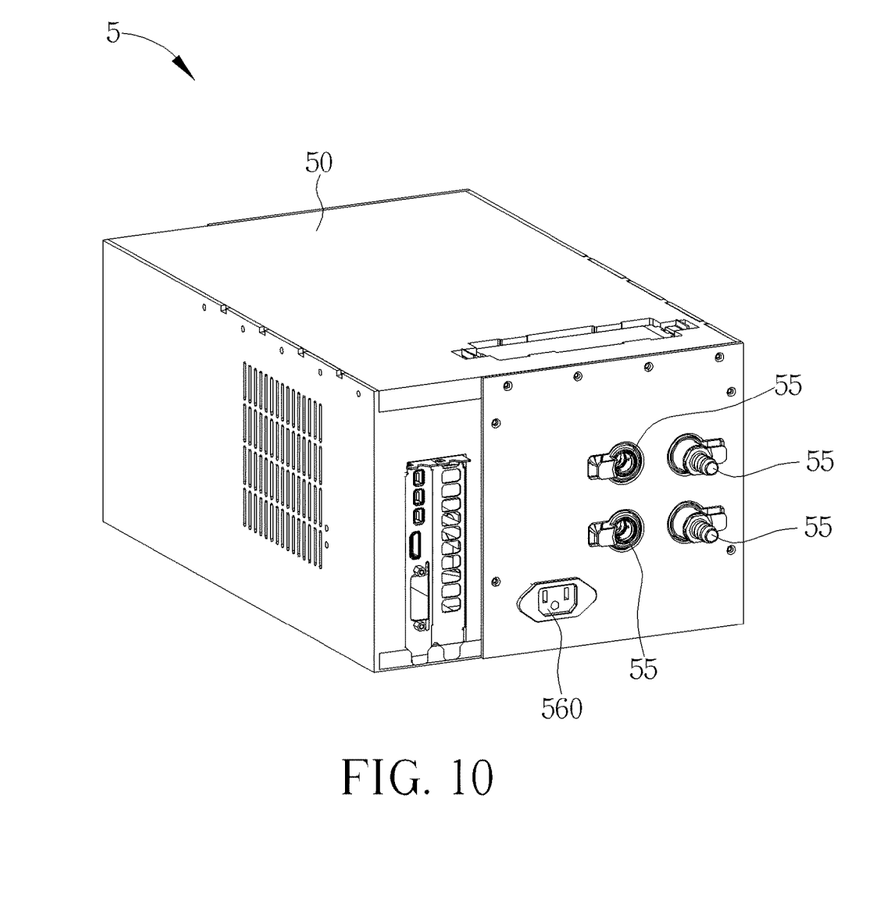
FIG. 10 is a schematic view illustrating an external function extension device according to another embodiment of the invention.
Figure 11:
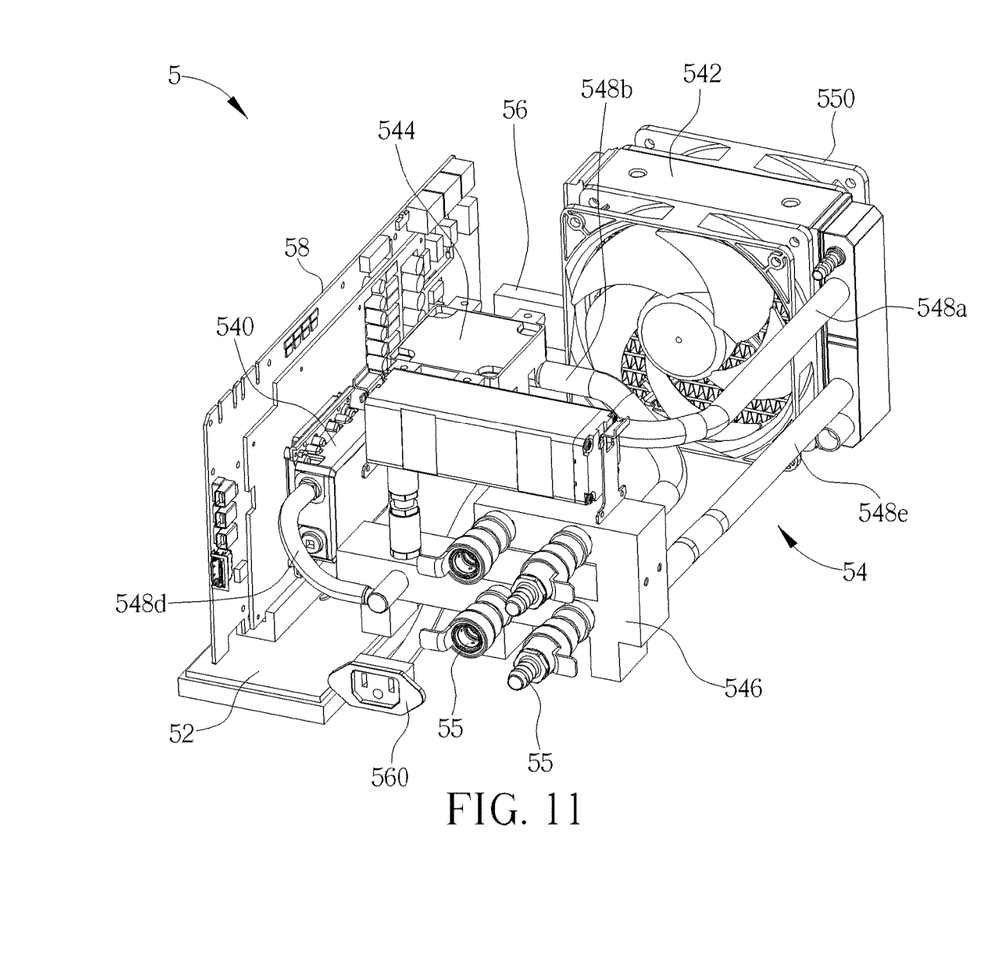
FIG. 11 is a schematic inner view illustrating the external function extension device shown in FIG. 10 after removing the casing.
Figure 12:
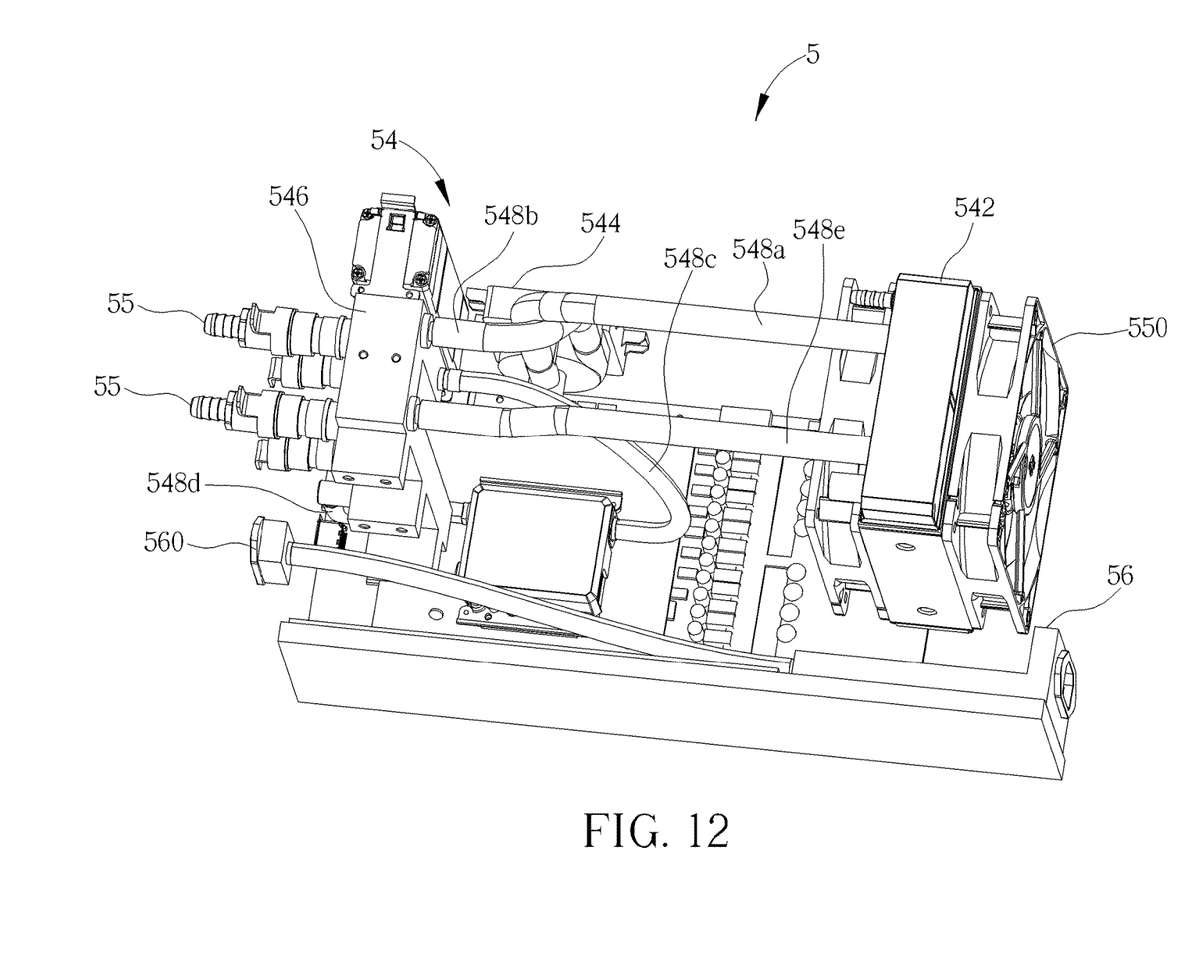
FIG. 12 is a schematic inner view illustrating the external function extension device shown in FIG. 10 after removing the casing from another viewing angle.
Figure 13:
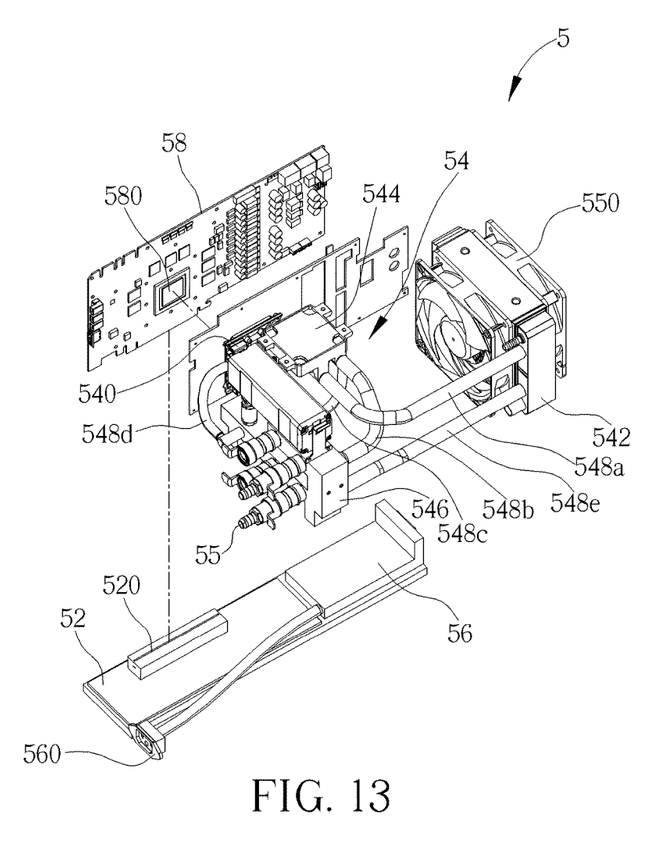
FIG. 13 is an exploded view illustrating the external function extension device shown in FIG. 11.
Figure 14:
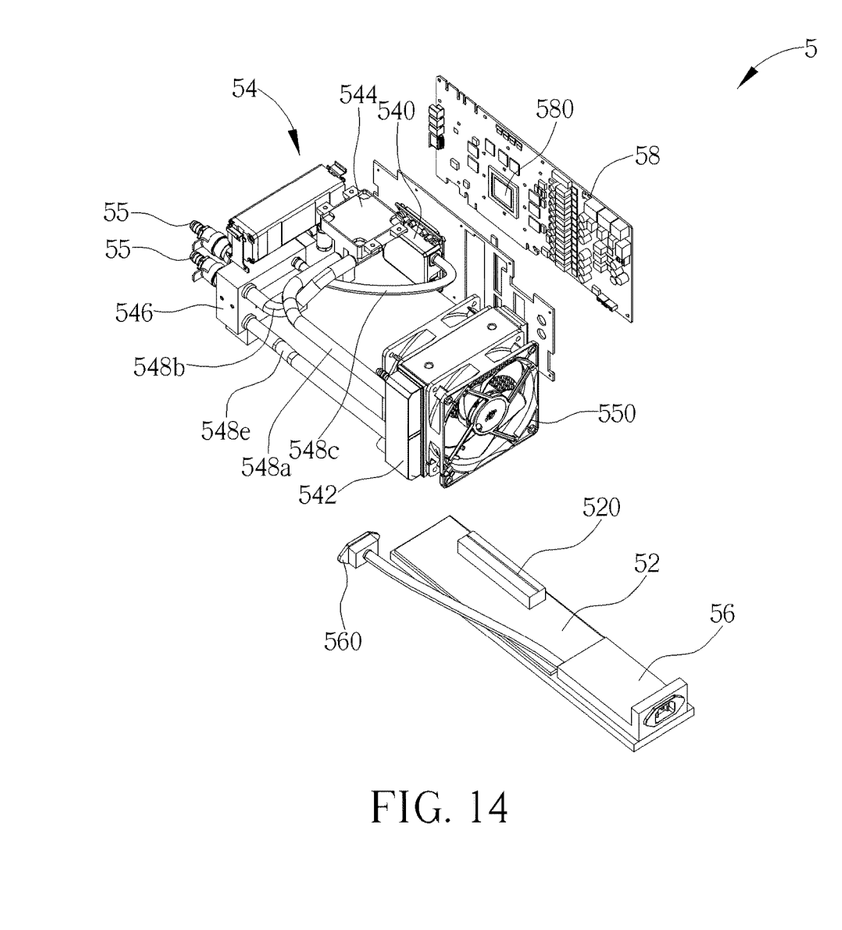
FIG. 14 is an exploded view illustrating the external function extension device shown in FIG. 11 from another viewing angle.

Referring to FIGS. 10 to 14, FIG. 10 is a schematic view illustrating an external function extension device 5 according to another embodiment of the invention, FIG. 11 is a schematic inner view illustrating the external function extension device 5 shown in FIG. 10 after removing the casing 50, FIG. 12 is a schematic inner view illustrating the external function extension device 5 shown in FIG. 10 after removing the casing 50 from another viewing angle, FIG. 13 is an exploded view illustrating the external function extension device 5 shown in FIG. 11, and FIG. 14 is an exploded view illustrating the external function extension device 5 shown in FIG. 11 from another viewing angle.

As shown in FIGS. 10 to 14, the external function extension device 5 comprises a casing 50, a transition circuit board 52, a liquid cooling system 54, at least one connecting member 55, a power supply unit 56 and a function extension card 58, wherein the transition circuit board 52, the liquid cooling system 54, the power supply unit 56 and the function extension card 58 are disposed in the casing 50 and the connecting member 55 is exposed from the casing 50. In this embodiment, the external function extension device 5 comprises four connecting members 55, but is not so limited. The transition circuit board 52 has a transition slot 520. The function extension card 58 is inserted into the transition card 520. The power supply unit 56 is electrically connected to the transition circuit board 52 and the liquid cooling system 54 and used for supplying power to the transition circuit board 52, the liquid cooling system 54 and the function extension card 58 when being operating.

In this embodiment, the function extension card 58 may be a graphics card, a sound card, a network card and so on according to practical applications. Furthermore, the function extension card 58 may be detachably inserted into the transition slot 520. Therefore, a user may insert the function extension card 58 into the transition slot 520 after purchasing the external function extension device 5 or, alternatively, a manufacturer may insert the function extension card 58 into the transition slot 520 before selling the external function extension device 5. In other words, the external function extension device 5 of the invention may or may not be equipped with the function extension card 58 in advance according to practical applications. Then, the user may connect the function extension card 58 of the external function extension device 5 to a computer (not shown), so as to enhance additional functions. Since the function extension card 58 is disposed in the external function extension device 5, the invention can prevent the function extension card 58 from occupying the limited space in the computer.

In this embodiment, the liquid cooling system 54 may comprise a cold plate 540, a radiator 542, a pump 544, a bypass device 546, a plurality of tubes 548a-548e and at least one fan 550. The tube 548a connects the radiator 542 and the pump 544, the tube 548b connects the pump 544 and the bypass device 546, the tubes 548c, 548d connect the cold plate 540 and the bypass device 546, and the tube 548e connects the bypass device 546 and the radiator 542. Furthermore, the fan 550 is disposed at a side of the radiator 542.

When the function extension card 58 is inserted into the transition slot 520, the cold plate 540 may be attached to a processing chip 580 of the function extension card 58, so as to absorb heat generated by the processing chip 580 when being operating and then dissipate heat through the radiator 542 and the fan 550. In practical applications, the liquid cooling system 54 contains a cooling liquid (e.g. water or other liquids, not shown). Accordingly, the invention can use the liquid cooling system 54 to dissipate heat of the function extension card 58, so as to enhance heat dissipating efficiency for the function extension card 58.

When the liquid cooling system 54 is dissipating heat for the function extension card 58, the cooling liquid flows from the radiator 542 to the pump 544 through the tube 548a. Then, the pump 544 outputs the cooling liquid to the bypass device 546 through the tube 548b. Then, the cooling liquid flows from the bypass device 546 to the cold plate 540 through the tube 548c. Then, the cooling liquid flows from the cold plate 540 to the bypass device 546 through the tube 548d. Finally, the cooling liquid flows from the bypass device 546 to the radiator 542 through the tube 548e. Accordingly, the cold plate 540, the radiator 542, the pump 544, the bypass device 546 and the tubes 548a-548e form an internal liquid cooling circulation path of the external function extension device 5.

In this embodiment, the connecting member 55 is connected to the bypass device 546 of the liquid cooling system 54, wherein the connecting member 55 is used for connecting an external device (not shown), such that the liquid cooling system 54 performs liquid cooling function for dissipating heat of the external device. In practical applications, the external device may be a computer or other electronic devices. The connecting member 55 may be a quick connector, such that the external device may be connected to or separated from the connecting member 55 rapidly and conveniently. In practical applications, the liquid cooling system 54 contains a cooling liquid (e.g. water or other liquids). Accordingly, in some embodiments, the quick connector served as the connecting member 55 may have quick attaching/detaching structure and have some structures for preventing the cooling liquid from leaking out of the liquid cooling system 54. Therefore, when the external device is separated from the connecting member 55, the connecting member 55 may prevent the cooling liquid from leaking out of the liquid cooling system 54.

The user may connect the external device to the connecting member 55, such that the external device and the bypass device 546 of the liquid cooling system 54 form an external liquid cooling circulation path through the connecting member 55. At this time, the liquid cooling device 54 of the external function extension device 5 may dissipate heat for the external device. By means of the bypass structure in the bypass device 546, the bypass device 546 may separate the cooling liquid in the external liquid cooling circulation path for dissipating heat for the external device from the cooling liquid in the internal liquid cooling circulation path for dissipating heat for the function extension card 58, so as to prevent the cooling liquids in the two paths from interfering with each other after absorbing heat and then prevent heat dissipating efficiency from being affected.

In this embodiment, the power supply unit 56 comprises an electric connector 560. The user may connect the electric connector 560 to the external device by a power cable (not shown), such that the power supply unit 56 supplies power to the external device. In other words, the power supply unit 56 of the external function extension device 5 not only can supply power to the transition circuit board 52, the liquid cooling system 54 and the function extension card 58 when being operating but also can supply power to the external device through the power cable. Accordingly, the external function extension device 5 of the invention may selectively provide functions of graphics card, heat dissipation and/or power supply for the external device, such that the functions of the external function extension device 5 of the invention may be more various.

As mentioned in the above, the invention integrates the transition circuit board with the transition slot and the liquid cooling system into the external function extension device. A user may insert a function extension card (e.g. graphics card, sound card, network card and so on) into the transition slot after purchasing the external function extension device or, alternatively, a manufacturer may insert a function extension card into the transition slot before selling the external function extension device. Then, the user may connect the function extension card of the external function extension device to a computer, so as to enhance additional functions. Since the function extension card is disposed in the external function extension device, the invention can prevent the function extension card from occupying the limited space in the computer. Furthermore, since the external function extension device has the liquid cooling system disposed therein, the invention can use the liquid cooling system to dissipate heat of the function extension card, so as to enhance heat dissipating efficiency for the function extension card. Moreover, the user may use the connecting member to connect the external device, such that the liquid cooling system performs liquid cooling function for dissipating heat of the external device. Still further, the user may use the electric connector to connect the external device, such that the power supply unit supplies power to the external device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An external function extension device, adapted to be externally electrically connected to a computer so as to provide extension functions to the computer, the external function extension device comprising:
   a casing;
   a transition circuit board disposed in the casing, the transition circuit board having a transition slot;
   a liquid cooling system disposed in the casing; and
   a power supply unit disposed in the casing and electrically connected to the transition circuit board and the liquid cooling system,
   wherein the transition slot, the liquid cooling system and the power supply unit are all disposed at the same side of the transition board, the liquid cooling system comprises a radiator and at least one fan, and the radiator is in contact with the power supply unit and is located between the transition slot and the at least one fan.

2. The external function extension device of claim 1, further comprising a function extension card disposed in the casing and inserted into the transition slot.

3. The external function extension device of claim 2, wherein the function extension card is a graphics card.

4. The external function extension device of claim 1, wherein the liquid cooling system comprises a cold plate, a radiator and at least one fan.

5. The external function extension device of claim 1, further comprising at least one connecting member connected to the liquid cooling system, the connecting member being used for connecting an external device.

6. The external function extension device of claim 5, wherein the connecting member is a quick connector.

7. An external function extension device, adapted to be externally electrically connected to a computer so as to provide extension functions to the computer, the external function extension device comprising:
   a casing;
   a transition circuit board disposed in the casing, the transition circuit board having a transition slot;
   a liquid cooling system disposed in the casing;
   at least one connecting member connected to the liquid cooling system, the connecting member being used for connecting an external device, such that the liquid cooling system performs a liquid cooling function for dissipating heat of the external device; and
   a power supply unit disposed in the casing and electrically connected to the transition circuit board and the liquid cooling system, the power supply unit comprising an electric connector, the electric connector being used for connecting the external device, such that the power supply unit supplies power to the external device,
   wherein the transition slot, the liquid cooling system and the power supply unit are all disposed at the same side of the transition board, the liquid cooling system comprises a radiator and at least one fan, and the radiator is in contact with the power supply unit and is located between the transition slot and the at least one fan.

8. The external function extension device of claim 7, wherein the liquid cooling system comprises a cold plate, a radiator, a pump, a bypass device and a plurality of tubes; the tubes connect the cold plate, the radiator, the pump and the bypass device; the cold plate, the radiator, the pump, the bypass device and the tubes form an internal liquid cooling circulation path.

9. The external function extension device of claim 8, wherein when the connecting member connects the external device, the external device and the bypass device form an external liquid cooling circulation path through the connecting member.

10. The external function extension device of claim 7, further comprising a function extension card disposed in the casing and inserted into the transition slot.

11. The external function extension device of claim 10, wherein the function extension card is a graphics card.

12. The external function extension device of claim 7, wherein the connecting member is a quick connector.

* * * * *